United States Patent [19]

Chen et al.

[11] 4,362,809

[45] Dec. 7, 1982

[54] MULTILAYER PHOTORESIST PROCESS UTILIZING AN ABSORBANT DYE

[75] Inventors: Mung Chen, Los Altos; William R. Trutna, Jr., Palo Alto; Michael P. C. Watts, Sunnyvale, all of, CA; Keith G. Bartlett; Gary Hillis, Ft. Collins, both of Colo.

[73] Assignee: Hewlett-Packard Company, Palo Alto, Calif.

[21] Appl. No.: 248,761

[22] Filed: Mar. 30, 1981

[51] Int. Cl.³ ............................ G03F 7/02; G03C 1/76
[52] U.S. Cl. .................................. 430/312; 430/394; 430/396; 430/502; 430/503
[58] Field of Search .............. 430/312, 316, 311, 317, 430/313, 319, 320, 321, 322, 323, 326, 329, 394, 396, 502, 503, 156; 156/661.1, 659.1

[56] References Cited

U.S. PATENT DOCUMENTS

| | | | |
|---|---|---|---|
| 3,628,954 | 12/1971 | Robillard et al. | 430/156 |
| 3,751,248 | 8/1973 | Goell | 430/312 |
| 4,102,683 | 7/1978 | DiPiazza | 430/319 |
| 4,123,272 | 10/1978 | Quinn | 430/329 |
| 4,267,259 | 5/1981 | Bohlen et al. | 430/312 |
| 4,289,844 | 9/1981 | Specht et al. | 430/311 |

FOREIGN PATENT DOCUMENTS 54-109423  8/1979  Japan ............................ 430/292

OTHER PUBLICATIONS

IBM Technical Disclosure, Khoury et al., vol. 13, No. 1, 1970 p. 38.
Lin, SPIE, vol. 174 Developments in Semiconductor Microlithography IV (1979) pp. 114-121.

Primary Examiner—Mary F. Downey
Attorney, Agent, or Firm—John A. Frazzini

[57] ABSTRACT

An improved photoetch technique is presented of the portable-conformable-mask type wherein a thin top layer of resist and a thick planarizing layer are deposited on a substrate and the thin layer is exposed and developed to produce a portable-conformable-mask. The improvement involves dissolving a suitable dye in a layer between the thin top layer and the substrate. The dye is preferably selected to absorb light of the wavelengths used to expose the top layer but does not interfere with processing of the other layers.

8 Claims, 4 Drawing Figures

MULTILAYER PHOTORESIST PROCESS UTILIZING AN ABSORBANT DYE

BACKGROUND OF THE INVENTION

This invention relates generally to photoresist processes for etching semiconductor devices and particularly to a multilevel photoresist process utilizing an absorbant dye to improve line resolution and uniformity.

In integrated circuit technology, significant effort has been expended on increasing the resolution of photoresist processes because greater resolution enables a greater number of circuits to be placed on a single chip. This increase in circuit density increases the potential complexity and speed of the resulting integrated circuit.

Present techniques in optical projection printing can resolve 1 micron lines in photoresist with good linewidth control when flat, low reflectivity substrates are used. However, when exposing resist on substrates with surface topography, there are resist control problems introduced by optical reflections and by resist thickness non-uniformity.

Reflection of light from the substrate-resist interface produces variations in the light intensity in the resist during exposure resulting in non-uniform linewidth. Light can scatter from the interface into regions of the resist where no exposure was intended resulting in a broadening or blooming of the linewidth. The amount of scattering and reflection will typically vary from region to region resulting in linewidth non-uniformity.

To eliminate the effects of chromatic aberration, monochromatic or quasi-monochromatic light is commonly used in resist projection printing techniques to expose the resist. Unfortunately, the effects of interface reflections on resolution is particularly significant when monochromatic or quasi-monochromatic light is used to expose the resist. When such light reflects from the substrate-resist interface, the reflected light interferes with the incident light to form standing waves within the resist. In the case of highly reflective substrate regions, the resulting large standing wave ratio creates thin layers of under-exposed resist at the standing wave minima. The under-exposed layers can prevent complete resist development causing a jagged resist profile. Part of the reflected light also reflects back to the substrate from the top surface of the resist. Such multiple reflection of the incident light between the top and bottom surfaces of the resist layer results in a resonance affecting the light intensity within the resist. The time required to expose the resist is generally an increasing function of resist thickness because of the increased total amount of light required to expose an increased amount of resist. However, because of the resonant effect, the time of exposure also includes a harmonic component which varies between successive maximum and minimum values as the resist thickness varies through a quarter wavelength of the incident light. If the resist thickness is non-uniform, there will be a non-uniform exposure resulting in variable linewidth control.

The photoresist linewidth control problems due to scattering and reflection from the substrate-resist interface can be solved by reducing or eliminating the substrate reflection. In one prior proposal (H. A. Koury and K. V. Patel, "Anti-Interference Phenomena Coating", IBM Technical Disclosure Bulletin, Vol. 13, No. 1, page 38, June 1970) a thin ultraviolet light absorbing layer containing a dye such as methyl orange or methanil yellow is deposited at the substrate-resist interface.

Linewidth control problems also arise from substrate topography. As indicated above, the resonance effect and resist thickness variation can combine to produce linewidth non-uniformity. In addition, when a layer of resist is exposed and developed, the resulting resist pattern will typically have sloping walls so that the width of the resist pattern at the surface of the substrate will vary with the resist thickness. Because a layer of material deposited on a non-flat surface will inherently vary in thickness, substrate topography will produce linewidth control problems. The problems due to substrate surface topography are addressed in the portable conformable mask (PCM) technique disclosed in the article entitled "Portable conformable mask—a hybrid near-ultraviolet and deep-ultraviolet patterning technique" by B. J. Lin in SPIE Vol. 174 Developments in Semiconductor Microlithography IV, page 114 (1979). In that technique a thick bottom layer (1-3 micron) of polymethyl methacrylate (PMMA) is deposited on the substrate to produce a planar surface on which a thin (0.2 micron) layer of a second resist is deposited. The top resist is then exposed (e.g. by a projection printing technique using near-ultraviolet light or electron beam exposure) and developed to produce a mask which is opaque to deep-ultraviolet light. The bottom layer of PMMA is then exposed through the mask with deep-ultraviolet light and is developed to produce the desired resist pattern. The polychromatic deep-ultraviolet exposure reduces the reflection problems associated with the exposure of the bottom resist layer but the reflection problem is not addressed as it affects the exposure of the top layer. To further improve line resolution a technique is required which addresses both the problems caused by interface reflectivity and caused by substrate surface topography.

SUMMARY OF THE INVENTION

In accordance with the preferred embodiment illustrated in FIGS. 1-3 a modified portable-conformable-mask technique is disclosed. In FIG. 1 is shown a substrate on which a metal interconnect has been deposited. Metal interconnects present one of the biggest obstacles to good linewidth resolution in subsequent resist pattern development because such interconnects not only produce problems due to surface topography but also produce local regions of high reflectivity. The substrate is covered with a bottom layer of resist of sufficient thickness (approximately 1.5 micron) to produce a planar top surface. A thin (approximately 1 micron) top layer is deposited on top of the planar surface for production of a portable-conformable-mask.

The top resist is selected to be sensitive at wavelengths outside the range in which the bottom resist is sensitive. The light used to expose the top resist is selected to be in the range in which the top resist is sensitive and the bottom resist is not. That light can also be selected to be monochromatic or quasi-monochromatic to avoid chromatic aberration. The top and bottom resist should have nearly equal index of refraction at this wavelength to avoid reflecting the light from the interface between the top and bottom resists. As a result of these parameter choices and the thin planar character of the top layer the light which is projected through a mask onto the top layer by standard projection printing techniques, exposes the top layer with sharply focussed light without activating portions of the bottom layer with defocussed light.

The dye in the bottom layer is selected to absorb significantly in the range of wavelengths used to expose the top resist layer and is sufficiently concentrated to reduce the problems due to substrate-resist interface reflections to an acceptable level. The dye must therefore be sufficiently soluble in the bottom resist to allow this level of concentration to be achieved. In addition the dye must not lose its absorbtive properties or interface with the bottom resist exposure and development even after subjection to the bake temperatures used for the top and bottom resist layers. The dye should also not crystallize when the carrier for the bottom layer evaporates since that would produce non-uniform and potentially incomplete absorbtion. Preferably the dye should be substantially transparent to the light used to expose the bottom layer, otherwise the exposure time required for the bottom layer will be significantly increased thereby reducing processing speed and increasing costs. The dye should also be substantially transparent at some point within the visible wavelength range to facilitate alignment during projection printing. The dye must also not contain elements such as sodium and potassium which can contaminate the integrated circuit.

DESCRIPTION OF THE PREFERRED EMBODIMENT

Figure 1:
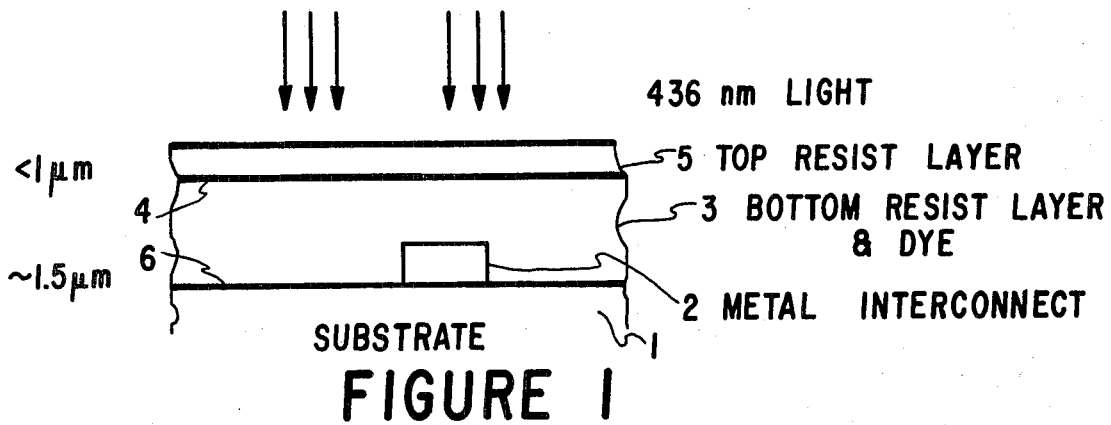
FIG. 1 illustrates the top layer exposure step of a process in accordance with the disclosed invention.
Figure 2:
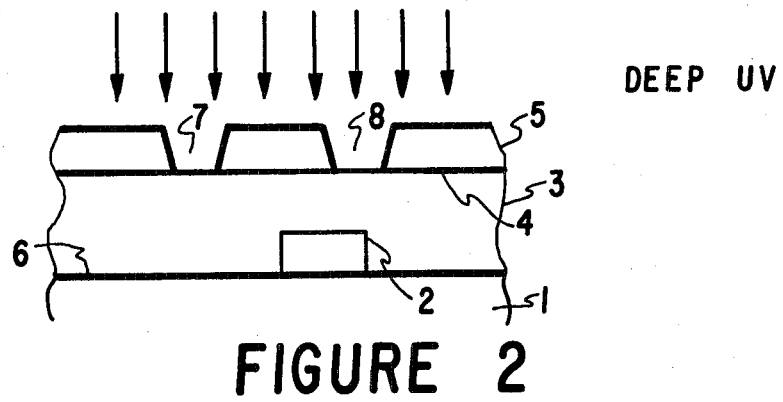
FIG. 2 illustrates the bottom layer exposure step of a process in accordance with the disclosed invention.

In FIGS. 1-3 a portable conformable mask technique is disclosed which utilizes an absorbing dye to reduce or eliminate problems caused by reflections from the substrate-resist interface. A bottom resist layer 3 of polymethyl methacrylate (also known as PMMA and available from DuPont Company, Wilmington, Delaware 19898) doped with 2.6% coumarin 6 laser dye (manufactured by Eastman Kodak Company, Rochester, New York 14650) is deposited on a substrate 1 having a metal interconnect 2. The bottom layer is sufficiently thick (approximately 1.5 micron) to produce a substantially planar top surface 4. The bottom layer is baked for 1 hour at 175° C. and then a thin (less than 1 micron) top resist layer 5 of Kodak 809 positive resist (manufactured by Eastman Kodak Company) is deposited on planar surface 4. The Kodak 809 resist is opaque in the 200-250 nm region where PMMA is sensitive so that after development, the top layer acts as a contact mask for the bottom layer. The top layer is baked at 82° C. for 40 minutes before exposure to pattern the top layer.

FIG. 1 illustrates the processing step in which the top layer 5 is exposed by light from a 436 nm projection printer. The PMMA is not sensitive at this wavelength so that this light is only effective in exposing top resist layer 5. At an exposure intensity of about 1 mW/cm$^2$ the coumarin dye is sufficiently concentrated in the bottom layer and is sufficiently absorptive at the 436 nm wavelength that 80% of the light entering bottom layer 3 is absorbed in a single pass through that layer. If the exposure intensity is increased to 300 mW/cm$^2$ the single pass absorption decreases to approximately 60% due to saturation of the absorbing dye transition. The 60% absorption level is still sufficient so that approximately 300 mW/cm$^2$ exposure intensity is employed to expose the top resist. The absorption band of coumarin 6 is narrow and it does not significantly absorb in the visible range so that its presence does not interfere with viewing the alignment marks on the substrate during projection printing alignment.

The absorption of the 436 nm light by the dyed bottom resist layer improves linewidth resolution in the top layer 5 by reducing reflections from the interface 6 between the substrate 1 and the bottom resist layer 3. Therefore good linewidth control is preserved when the top layer 5 is developed to produce the portable conformable mask. The top layer is developed by immersion for 90 seconds in a 7.5% solution of MX 931-1 Kodak developer in deionized water followed by a rinse with deionized water.

Figure 3A:
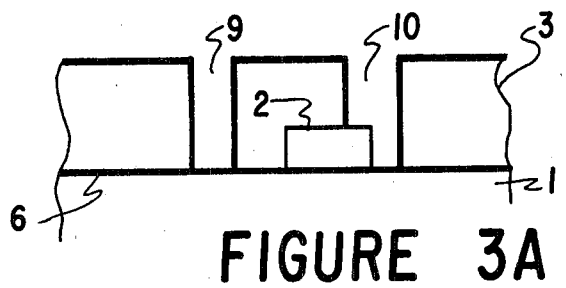
FIG. 3a illustrates the resist pattern which results from a process in accordance with the disclosed invention in which the top resist layer has been removed during development of the bottom layer.
Figure 3B:
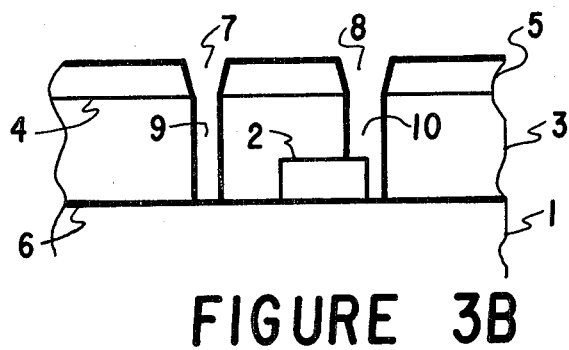
FIG. 3b illustrates the resist pattern which results from a process in accordance with the disclosed invention in which the top resist layer has not been removed during development of the bottom layer.

In FIG. 2 the bottom layer is exposed through the developed regions such as regions 7 and 8 in the top resist layer 5 with deep-ultraviolet light of intensity 25-30 mW/cm$^2$ supplied by a 1000 W Hg-Xe short arc lamp. The bottom layer accurately replicates the top layer pattern for a number of reasons. First, the broad band deep-ultraviolet exposure of the bottom layer reduces standing wave and resonance effects within the bottom layer. Secondly, the reflectivity of most materials decreases at the deep-ultraviolet wavelengths used for PMMA exposure. In addition, the high frequencies employed reduce diffraction and result in high contrast exposure of the bottom layer. To preserve this high contrast it is important that the dye not absorb strongly at the high frequencies employed in the PMMA development. Coumarin unfortunately does absorb somewhat in the 220-250 nm region but is not absorbed strongly enough to significantly degrade linewidth resolution. With about a factor of two increase in ultraviolet exposure time the dyed PMMA produces the same vertical sidewalls as undyed PMMA. The bottom layer is developed by a succession of immersions in a 100% solution of methyl isobutyketone (MIBK) for 90 seconds in a 25% solution of MIBK in isopropanol for 90 seconds and in a 100% solution of isopropanol for 60 seconds followed by a rinse with deionized water. The structure resulting from this development step is shown in FIG. 3a. Other developers, such as chlorobenzene, which can be used to develop the bottom layer, leave the top layer intact resulting in a structure like that shown in FIG. 3b.

A surprising advantage of coumarin as the selected dye is that it bleaches under exposure by the deep-ultraviolet light. As a result of this bleaching action exposure time for the bottom layer is reduced from that which would exist without bleaching and resolution is improved.

We claim:

1. An improved process of photoetching a substrate, of the portable-conformable-mask type wherein a first resist is deposited on the substrate to produce a bottom resist layer having a substantially planar top surface, a second resist is deposited as a top resist layer producing a multilayer substrate coating having the bottom resist layer sandwiched between the substrate and the top resist layer, the top resist layer is exposed to light in a range in which the second resist is insensitive, said light having been passed through a mask to expose only selected portions of the top resist layer, the top layer is developed to produce a portable-conformable-mask, and the layers of the substrate coating other than the top resist layer are processed to replicate the pattern of this portable-conformable-mask into such layers, the improvement comprising:

selecting a dye which strongly absorbs light at the wavelengths used to expose the top resist:

dissolving the dye in a layer of resist which is sandwiched between the substrate and the top layer; and replicating the pattern of the portable-conformable-mask into the layer of resist containing the dye by exposing this layer through an associated portable-conformable-mask which has been produced in a layer of resist above the layer of resist containing the dye and then developing the layer of resist containing the dye and then developing the layer of resist containing the dye, said exposure of the layer of resist containing the dye being at a wavelength at which the associated portable-conformable-mask is opaque and at which the layer containing the dye is photosensitive.

2. A process as recited in claim 1 wherein the dye does not substantially absorb at least one wavelength in the range of visible light.

3. A process as recited in claim 1 wherein the layer in which the dye is absorbed is the bottom resist layer.

4. A process as recited in claim 1 wherein the light used to expose the top resist layer is substantially monochromatic.

5. A process as recited in claim 1 wherein the dye does not substantially absorb at the wavelengths at which the layer of resist containing the dye is exposed.

6. A process as recited in claim 1 wherein the dye bleaches at wavelengths in the range in which both the first resist is sensitive and the portable-conformable-mask is opaque.

7. A process as recited in claim 1 wherein the first resist is polymethyl methacrylate and wherein the dye is coumarin 6.

8. A process as recited in claim 1 wherein the first resist is strongly absorbant at the wavelength used to expose the top resist layer whereby the first resist itself functions as the dye.

* * * * *

UNITED STATES PATENT AND TRADEMARK OFFICE
CERTIFICATE OF CORRECTION

PATENT NO.  : 4,362,809

DATED       : December 7, 1982

INVENTOR(S) : Mung Chen, William R. Trutna, Jr., Michael P. C. Watts, Keith G. Bartlett, and Gary Hillis It is certified that error appears in the above-identified patent and that said Letters Patent is hereby corrected as shown below:

Column 5, Line 3

"insensitive" should be --sensitive--

Signed and Sealed this

Twenty-first Day of January 1986

[SEAL]

Attest:

DONALD J. QUIGG

Attesting Officer

Commissioner of Patents and Trademarks